(12) United States Patent
Yoshii

(10) Patent No.: US 9,574,091 B2
(45) Date of Patent: Feb. 21, 2017

(54) CONDUCTIVE PASTE

(71) Applicant: NAMICS CORPORATION, Niigata-shi, Niigata (JP)

(72) Inventor: Yoshiaki Yoshii, Niigata (JP)

(73) Assignee: NAMICS CORPORATION, Niigata-Shi, Niigata (JP)

( * ) Notice: Subject to any disclaimer, the term of this patent is extended or adjusted under 35 U.S.C. 154(b) by 0 days.

(21) Appl. No.: 14/436,565

(22) PCT Filed: Oct. 18, 2013

(86) PCT No.: PCT/JP2013/078260
§ 371 (c)(1),
(2) Date: Apr. 17, 2015

(87) PCT Pub. No.: WO2014/061765
PCT Pub. Date: Apr. 24, 2014

(65) Prior Publication Data
US 2015/0299477 A1  Oct. 22, 2015

(30) Foreign Application Priority Data
Oct. 19, 2012 (JP) ................................. 2012-231664

(51) Int. Cl.
| H01B 1/20 | (2006.01) |
| H01B 1/22 | (2006.01) |
| C09D 5/24 | (2006.01) |
| C09D 7/12 | (2006.01) |
| C09D 201/00 | (2006.01) |
| H05K 1/09 | (2006.01) |
| H01B 1/16 | (2006.01) |
| H05K 1/18 | (2006.01) |
| H05K 3/10 | (2006.01) |

(52) U.S. Cl.
CPC . *C09D 5/24* (2013.01); *C09D 7/12* (2013.01); *C09D 201/00* (2013.01); *H01B 1/16* (2013.01); *H01B 1/22* (2013.01); *H05K 1/092* (2013.01); *H05K 1/18* (2013.01); *H05K 3/10* (2013.01); *H05K 2201/032* (2013.01); *H05K 2203/1126* (2013.01); *H05K 2203/12* (2013.01)

(58) Field of Classification Search
CPC .................................... H01B 1/20; H01B 1/22
USPC ..................... 252/512, 514, 518.1
See application file for complete search history.

(56) References Cited

U.S. PATENT DOCUMENTS

| 2004/0155227 A1 | 8/2004 | Bechtloff et al. |
| 2006/0231803 A1 | 10/2006 | Wang et al. |
| 2009/0101872 A1 | 4/2009 | Young et al. |
| 2009/0140217 A1 | 6/2009 | Wang et al. |
| 2011/0006268 A1 | 1/2011 | Wang et al. |
| 2011/0209751 A1 | 9/2011 | Nojiri et al. |
| 2011/0277831 A1 | 11/2011 | Yoshida et al. |
| 2012/0119165 A1 | 5/2012 | Wang et al. |
| 2013/0004716 A1* | 1/2013 | Koh ......................... H01B 1/22 428/156 |
| 2014/0124713 A1* | 5/2014 | Majumdar ............... H01B 1/22 252/513 |

FOREIGN PATENT DOCUMENTS

| CN | 101816045 A | 8/2010 | |
| DE | 10116653 A1 | 10/2002 | |
| JP | 55149356 A | 11/1980 | |
| JP | 63119105 A | 5/1988 | |
| JP | 04230002 A | 8/1992 | |
| JP | 2003115216 A | 4/2003 | |
| JP | 2006196421 A | 7/2006 | |
| JP | 2006313744 A | 11/2006 | |
| JP | 2007123301 A | 5/2007 | |
| WO | WO 2012135551 A1 * | 10/2012 | ............... H01B 1/22 |

OTHER PUBLICATIONS

International Search Report (ISR) dated Jan. 7, 2014 issued in International Application No. PCT/JP2013/078260.
Extended European Search Report dated May 2, 2016, issued in counterpart European Application No. 13847147.9.
Chinese Office Action dated Feb. 6, 2016, issued in counterpart Chinese Application No. 201380054091.0.

* cited by examiner

*Primary Examiner* — Khanh Tuan Nguyen
*Assistant Examiner* — Haidung Nguyen
(74) *Attorney, Agent, or Firm* — Holtz, Holtz & Volek PC

(57) ABSTRACT

A conductive paste including: (A) a silver powder; (B) a glass frit; (C) an organic binder; and (D) a powder containing copper, tin, and manganese.

11 Claims, 1 Drawing Sheet

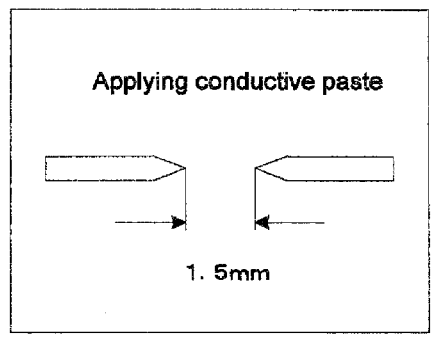
(a)
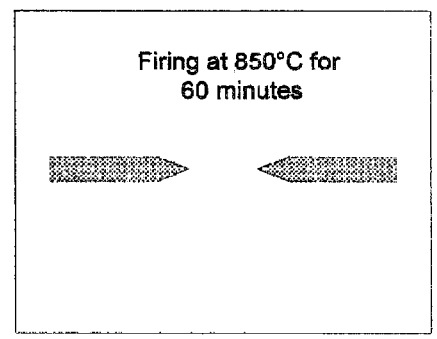
(b)
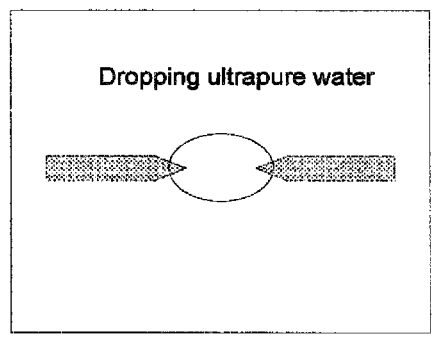
(c)
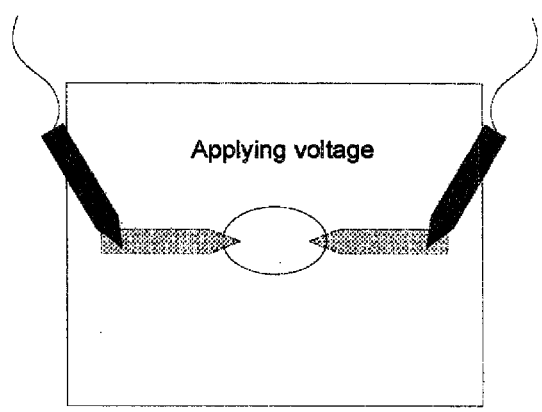
(d)

CONDUCTIVE PASTE

TECHNICAL FIELD

The present invention relates to sintering type conductive paste that may be used for formation of, for example, a conductor pattern for a printed circuit board.

BACKGROUND ART

There is known conductive paste having metal particles dispersed in a vehicle of an organic binder and a solvent. Conductive paste is used for formation of a conductor pattern for a printed circuit board, formation of an electrode for an electronic part, and the like. Such conductive paste may be roughly classified into a resin curing type and a firing type. Conductive paste of the resin curing type is conductive paste having conductivity secured by making metal particles contact with each other due to curing of a resin. Conductive paste of the firing type is conductive paste having conductivity secured by sintering metal particles with each other due to firing.

As the metal particles contained in the conductive paste, copper powder and silver powder, for example, are used. Copper powder is advantageous in excellent in conductivity and more inexpensive than silver powder. However, copper powder is prone to be oxidized in an air atmosphere, so that it is disadvantageous in that, after forming a conductor pattern on a substrate, for example, a surface of the conductor pattern has to be coated with a protective material. In contrast, silver powder is advantageous in that it is stable in an air and that a conductor pattern may be formed by firing in an air atmosphere while it is disadvantageous in that electromigration is prone to occur.

As a technique to prevent electromigration, Patent Document 1 discloses conductive coating that has silver powder, as a main conductive material, characterized by containing from 1 to 100 parts by mass of powder of manganese and/or manganese alloy based on 100 parts by mass of silver powder. Patent Document 2 discloses conductive paste characterized by containing a binder resin, Ag powder, and at least one metal or metal compound selected from the group of Ti, Ni, Sn, and Sb.

However, the conductive paste disclosed in Patent Documents 1 and 2 is insufficient in the adhesion to a substrate and the soldering heat resistance, and there used to be a practical problem when it is used for formation of a conductor pattern on a substrate.

Then, as a technique to improve the soldering heat resistance of conductive paste, Patent Document 3 discloses conductive paste characterized by that silver powder is coated with a material containing a first metal component to inhibit sintering of silver and a second metal component to promote sintering of silver.

However, while the conductive paste disclosed in Patent Document 3 has improved soldering heat resistance to a certain extent, sintering of silver is inhibited, so that there used to be a problem of decreasing the conductivity of a conductor pattern obtained by firing the conductive paste. In addition, since a step of coating a surface of silver powder with a metal material is required, there used to be a problem of complex production steps.

PRIOR ART DOCUMENTS

Patent Documents

Patent Document 1: Japanese Patent Application Kokai Publication No. Sho 55-149356

Patent Document 2: Japanese Patent Application Kokai Publication No, 2003-115216

Patent Document 3: Japanese Patent Application Kokai Publication No. 2006-196421

DISCLOSURE OF THE INVENTION

Problems to be Solved by the Invention

It is an object of the present invention to provide sintered conductive paste excellent in electromigration resistance, soldering heat resistance, and adhesion to a substrate.

Means to Solve the Problems

The present inventor worked hard on sintering type conductive paste capable of sufficiently satisfying electromigration resistance, soldering heat resistance, and adhesion to a substrate. As a result, he has found that it is effective to add, in addition to silver powder, glass frit, and an organic binder, powder containing copper, tin, and manganese to complete the present invention.

The present invention is as follows.

(1) Conductive paste, including (A) through (D) components below:
  (A) silver powder;
  (B) glass frit;
  (C) organic binder; and
  (C) powder containing copper, tin, and manganese.

(2) The conductive paste according to (1) above, wherein the powder (D) is mixed powder of metal including copper, tin, and manganese.

(3) The conductive paste according to (1) above, wherein the powder (D) is powder of alloy containing copper, tin, and manganese.

(4) The conductive paste according to (1) above, wherein the powder (D) is powder of compound containing copper, tin, and manganese.

(5) The conductive paste according to any of (1) through (4) above, wherein the powder (D) contains an oxide or a hydroxide of any one or more of copper, tin, and manganese.

(6) The conductive paste according to any of (1) through (5) above, wherein from 0.1 to 5.0 parts by mass of the powder (D) are contained based on 100 parts by mass of the silver powder (A).

(7) The conductive paste according to any of (1) through (6) above, wherein a content of tin is from 0.01 to 0.3 at a mass ratio when a content of copper is 1.

(8) The conductive paste according to any of (1) through (7) above, wherein a content of manganese is from 0.01 to 2.5 at a mass ratio when a content of copper is 1.

(9) The conductive paste according to any of (1) through (8) above, wherein the silver powder (A) has an average particle diameter from 0.1 to 100 μm.

(10) The conductive paste according to any of (1) through (9) above, further including cobalt oxide (E).

(11) The conductive paste according to any of (1) through (10) above, further including bismuth oxide (F).

(12) The conductive paste according to any of (1) through (11) above, wherein viscosity is from 50 to 700 Pa·s.

(13) A printed circuit board obtained by, after applying the conductive paste according to any of (1) through (12) above on a substrate, firing the substrate from 500° C. to 900° C.

(14) An electronic device obtained by soldering an electronic part on the printed circuit board according to (13) above.

Effects of the Invention

According to the present invention, it is possible to provide sintering type conductive paste excellent in electromigration resistance, soldering heat resistance, and adhesion to a substrate.

BRIEF DESCRIPTION OF THE DRAWINGS

FIGS. 1(a)-(d) are diagrams to illustrate a method of evaluating electromigration resistance of conductive paste.

BEST MODE FOR CARRYING OUT THE INVENTION

A detailed description is given below to modes for carrying out the present invention.

Conductive paste according to an embodiment of the present invention is characterized by including:

(A) silver powder;
(B) glass frit;
(C) organic binder; and
(D) powder containing copper, tin, and manganese.

(A) Silver Powder

The conductive paste of the present invention contains silver powder (A) as conductive particles. As the silver powder in the present invention, it is possible to use powder of silver or alloy containing silver. The shape of the silver powder particles is not particularly limited, and it is possible to use silver powder particles in, for example, a spherical shape, a granular shape, a flake shape, or a scale shape.

It is preferred that the silver powder used in the present invention has an average particle diameter from 0.1 µm to 100 µm, more preferred that it is from 0.1 µm to 20 µm, and most preferred that it is from 0.1 µm to 10 µm. The average particle diameter here means a volume based median diameter (d50) obtained in a laser diffraction scattering type particle size distribution measurement method.

In order to cause the conductive paste to exhibit high conductivity, it is preferred that the silver powder contained in the conductive paste has a larger particle diameter. However, when the particle diameter of the silver powder is too large, applicability of the conductive paste on the substrate and workability turns out to be impaired. Accordingly, as long as the applicability of the conductive paste on the substrate and the workability are not impaired, it is preferred to use silver powder having a large particle diameter. Taking these issues into account, it is preferred that the silver powder used in the present invention has an average particle diameter in the above range.

A method of producing the silver powder is not particularly limited, and it may be produced in, for example, a reduction method, a grinding method, an electrolytic method, an atomization method, a heat treatment method, or a combination thereof. Silver powder in a flake shape may be produced by, for example, crushing silver particles in a spherical shape or a granular shape in a ball mill or the like.

(B) Glass Frit

The conductive paste of the present invention contains glass frit (B). The conductive paste contains the glass frit, thereby improving the adhesion of the conductor pattern obtained by firing the conductive paste to the substrate. The glass frit used for the present invention is not particularly limited, and it is possible to use glass frit preferably having a softening point of 300° C. or more, more preferably having a softening point from 400° C. to 1000° C., even more preferably having a softening point from 400° C. to 700° C.

It is possible to measure the softening point of the glass frit using a thermogravimeter (for example, TG-DTA2000SA manufactured by BRUKER AXS).

Specific examples of the glass frit may include glass frit based on bismuth borosilicate, alkali metal borosilicate, alkali earth metal borosilicate, zinc borosilicate, lead borosilicate, lead borate, lead silicate, bismuth borate, zinc borate, and the like. For environmental consciousness, it is preferred that the glass frit is lead free, and examples thereof may include glass frit based on bismuth borosilicate, alkali metal borosilicate, and the like.

The glass frit has an average particle diameter preferably from 0.1 to 20 µm, more preferably from 0.2 to 10 µm, and most preferably from 0.5 to 5 µm. The average particle diameter here means a volume based median diameter (d50) obtained in a laser diffraction scattering type particle size distribution measurement method.

In the conductive paste of the present invention, a content of the glass frit (B) is preferably from 0.01 to 20 parts by mass based on 100 parts by mass of the silver powder (A), and more preferably from 0.1 to 10 parts by mass. When the content of the glass fit is less than the ranges, the adhesion of the conductor pattern obtained by firing the conductive paste to the substrate decreases. On the contrary, when the content of the glass frit is more than the ranges, the conductivity of the conductor pattern obtained by firing the conductive paste decreases.

(C) Organic Binder

The conductive paste of the present invention contains organic binder (C). The organic binder in the present invention binds the silver powder to each other in the conductive paste and is also burned up during the firing of the conductive paste. The organic binder is not particularly limited, and it is possible to use, for example, a thermosetting resin or a thermoplastic resin.

As the thermosetting resin, it is possible to use, for example, an epoxy resin, a urethane resin, a vinyl ester resin, a silicone resin, a phenol resin, a urea resin, a melamine resin, an unsaturated polyester resin, a diallyl phthalate resin, a polyimide resin, and the like.

As the thermoplastic resin, it is possible to use, for example, a cellulose based resin, such as ethylcellulose and nitrocellulose, an acrylic resin, an alkyd resin, a saturated polyester resin, a butyral resin, polyvinyl alcohol, hydroxypropyl cellulose, and the like.

These resins may be used singly and may also be used by mixing two or more types.

In the conductive paste of the present invention, a content of the organic binder (C) is preferably from 0.5 to 30 parts by mass based on 100 parts by mass of the silver powder (A) and more preferably from 1.0 to 10 parts by mass.

When the content of the organic binder (C) in the conductive paste is in the above range, the applicability of the conductive paste on the substrate is improved and it is possible to form a fine pattern highly precisely. In contrast, when the content of the organic binder (C) exceeds the above range, the amount of the organic binder contained in the conductive paste is too large, so that there is a case of decreasing the density of the conductor pattern obtained after firing.

(D) Powder Containing Copper, Tin, and Manganese

The conductive paste of the present invention contains powder (D) containing copper, tin, and manganese. The powder (D) may be mixed powder of metal including copper, tin, and manganese, may also be powder of alloy containing copper, tin, and manganese, and may also be powder of compound containing copper, tin, and manganese.

The mixed powder of metal including copper, tin, and manganese is mixed powder of copper or copper alloy, tin or tin alloy, and manganese or manganese alloy.

The powder of alloy containing copper, tin, and manganese is powder of alloy containing copper, tin, and manganese.

The powder of compound containing copper, tin, and manganese is powder containing a copper compound, a tin compound, and a manganese compound.

The copper, tin, and manganese contained in the powder (D), respectively, may be elemental metal and may also be oxides. For example, the copper may be elemental metal (Cu) and may also be an oxide (for example, CuO). The tin may be elemental metal (Sn) and may also be an oxide (for example, SnO). The manganese may be elemental metal (Mn) and may also be an oxide (for example, MnO).

In addition, the copper, tin, and manganese contained in the powder (D) may also be compounds (for example, hydroxides) that change to oxides during the firing of the conductive paste. For example, the copper may also be $Cu(OH)_2$. The tin may also be $Sn(OH)_2$. The manganese may also be $Mn(OH)_2$.

Since the elemental metal of manganese has very high hardness, it is difficult to obtain metal powder having a uniform particle diameter. Accordingly, it is preferred that the manganese is in the form of an oxide (for example, MnO) or alloy.

According to the present invention, the manganese and tin produce an effect even in an extremely small amount of addition. In order to cause the powder (D) containing copper, tin, and manganese to be uniformly dispersed in the conductive paste, it is therefore preferred to use powder of alloy of manganese and tin.

The conductive paste contains the powder (D) containing copper, tin, and manganese, thereby improving all of the electromigration resistance, the soldering heat resistance, and the adhesion to the substrate of the conductive paste. Such an innovative effect has found for the first time by the present inventor. Although the reason why such effect is obtained has not been identified, the fact that such effect is obtained has been confirmed experimentally by the present inventor.

In the conductive paste of the present invention, a content of the powder (D) containing copper, tin, and manganese is preferably from 0.1 to 5.0 parts by mass based on 100 parts by mass of the silver powder (A), more preferably from 0.2 to 3.0 parts by mass, and even more preferably from 0.3 to 1.0 parts by mass.

When the content of the powder (D) containing copper, tin, and manganese in the conductive paste is in the above range, the electromigration resistance, the soldering heat resistance, and the adhesion to the substrate of the conductive paste are significantly improved.

In the conductive paste of the present invention, a content of copper (Cu) in terms of element is preferably from 0.005 to 2.85 parts by mass based on 100 parts by mass of the silver powder (A) and more preferably from 0.015 to 2 parts by mass.

In the conductive paste of the present invention, a content of tin (Sn) in terms of element is preferably from 0.0025 to 2.85 parts by mass based on 100 parts by mass of the silver powder (A), more preferably from 0.015 to 1 part by mass, and even more preferably from 0.02 to 0.075 parts by mass.

In the conductive paste of the present invention, a content of manganese (Mn) in terms of element is preferably from 0.0001 to 0.9 parts by mass based on 100 parts by mass of the silver powder (A) and more preferably from 0.0003 to 0.7 parts by mass.

In the conductive paste of the present invention, it is preferred that a content of tin in terms of element when the content of copper is 1 is from 0.01 to 0.3 at a mass ratio.

In the conductive paste of the present invention, it is preferred that a content of manganese in terms of element when the content of copper is 1 is from 0.01 to 2.5 at a mass ratio.

The contents of copper, tin, and manganese are adjusted in the above range, thereby further improving the electromigration resistance, the soldering heat resistance, and the adhesion to the substrate of the conductive paste. In addition, when the conductive paste contains copper, tin, and manganese, solder wettability of the conductive paste is improved more than the case of containing only two components among them.

The conductive paste of the present invention may contain a solvent for viscosity adjustment and the like.

The solvent may include, for example, alcohols, such as methanol, ethanol, and isopropyl alcohol (IPA), organic acids, such as ethylene acetate, aromatic hydrocarbons, such as toluene and xylene, N-alkyl pyrrolidones, such as N-methyl-2-pyrrolidone (NMP), amides, such as N,N-dimethylformamide (DMF), ketones, such as methyl ethyl ketone (MEK), cyclic carbonates, such as terpineol (TEL) and butylcarbitol (BC), water, and the like.

A content of the solvent is not particularly limited, and it is preferably from 1 to 100 parts by mass based on 100 parts by mass of the silver powder (A) and more preferably from 5 to 60 parts by mass.

The viscosity of the conductive paste of the present invention is preferably from 50 to 700 Pa·s and more preferably from 100 to 300 Pa·s. The viscosity of the conductive paste is adjusted in this range, thereby providing good applicability of the conductive paste on the substrate and handlability, and it is possible to apply the conductive paste on the substrate in a uniform thickness.

The conductive paste of the present invention may also contain other additives, such as a dispersant, a rheology regulator, and pigment, for example.

The conductive paste of the present invention may further contain an inorganic filler (for example, fumed silica, calcium carbonate, talc, and the like), a coupling agent (for example, a silane coupling agent such as α-glycidoxypropyltrimethoxysilane, a titanate coupling agent such as tetraoctylbis(ditridecyl phosphite)titanate, and the like), a silane monomer (for example, tris(3-(trimethoxysilyl)propyl)isocyanurate), a plasticizer (for example, a copolymer such as carboxyl-terminated polybutadiene-acrylonitryl, silicone rubber, and resin powder such as silicone rubber powder, silicone resin powder, acrylic resin powder), a flame retardant, an antioxidant, a deforming agent, and the like.

The conductive paste of the present invention may also contain a metal oxide. The metal oxide may include copper oxide, bismuth oxide, manganese oxide, cobalt oxide, magnesium oxide, tantalum oxide, niobium oxide, tungsten oxide, and the like. Among them, cobalt oxide improves the soldering heat resistance. Bismuth oxide promotes sintering of the silver powder and also improves the solder wettability.

The conductive paste of the present invention may be produced by mixing each component above using, for example, a mortar machine, a pot mill, a triple roll mill, a rotary mixer, a double shaft mixer, and the like.

Next, a description is given to a method of forming a conductor pattern on a substrate using the conductive paste of the present invention.

Firstly, the conductive paste of the present invention is applied on a substrate. A method of application is arbitrary and it is possible to apply using a known method, such as dispensing, jet dispensing, stencil printing, screen printing, pin transfer, and stamping, for example.

After applying the conductive paste on the substrate, the substrate is put into an electric furnace or the like. The conductive paste applied on the substrate is then fired from 500° C. to 1000° C., more preferably from 600° C. to 1000° C., and even more preferably from 700° C. to 900° C. Thus, the silver powder contained in the conductive paste is sintered with each other and also components, such as the organic binder contained in the conductive paste, are burned up.

The conductor pattern thus obtained is very highly conductive. It is also excellent in the electromigration resistance, the soldering heat resistance, and the adhesion to a substrate.

It is possible to use the conductive paste of the present invention for formation of a circuit of an electronic part, formation of an electrode, junction of an electronic part to a substrate, or the like. For example, it is possible to use for formation of a conductor circuit of a printed circuit board, formation of an external electrode of a laminated ceramic capacitor, and the like. It is possible to use the conductive paste of the present invention for formation of a conductor pattern (circuit pattern) on an alumina substrate for an LED reflector. In these uses, parts, lead wires, and the like are soldered to a conductor pattern formed using the conductive paste, and thus it is possible to utilize the good soldering heat resistance of the conductive paste of the present invention. Accordingly, by using the conductive paste of the present invention, it is possible to manufacture a printed circuit board and an electronic product that are excellent in electric properties.

EXAMPLES

A description is given below to Examples and Comparative Examples of the present invention.

[Materials for Conductive Paste]

The components (A) through (F) below were mixed at ratios of First through Twelfth Examples described in Table 1 and Table 2 and First through Seventh Comparative Examples described in Table 3 to prepare conductive paste. All ratios of each component in Tables 1 through 3 are shown in parts by mass.

(A) Silver Powder

Silver powder in a spherical shape having an average particle diameter of 5 μm.

(B) Glass Frit $Bi_2O_3$—$B_2O_3$ based glass frit having an average particle diameter of 5.2 μm and a softening point of 440° C.

(C) Organic Binder

As the organic binder, one produced by dissolving an ethylcellulose resin in butylcarbitol was used. The ratio of mixing the ethylcellulose resin and butylcarbitol is 30:70 (mass ratio).

(D-1) Powder of Alloy Containing Copper, Tin, and Manganese

Powder of alloy in a spherical shape having an average particle diameter of 3 μm produced by a gas atomization method in composition of Cu:Mn:Sn=90.5:7.0:2.5.

(D-2) Mixed Powder of Metal Including Copper, Tin, and Manganese

Copper: copper powder in a spherical shape having an average particle diameter of 3 μm.

Tin: tin powder in a spherical shape having an average particle diameter of 3 μm.

Manganese: manganese powder in a spherical shape having an average particle diameter of 3 μm.

(D-3) Mixed Powder Containing Oxides of Copper, Tin, and Manganese

Powder obtained by mixing a copper oxide (II), tin oxide (IV), and manganese oxide (IV).

(E) Cobalt Oxide

CoO (cobalt oxide (II)) powder having an average particle diameter of 3 μm.

(F) Bismuth Oxide $Bi_2O_3$ (bismuth oxide (III)) powder having an average particle diameter of 3 μm.

[Fabrication of Conductor Pattern]

The conductive paste of First through Twelfth Examples and First through Seventh Comparative Examples was applied on alumina substrates by stencil printing. FIG. 1(a) illustrates the shape (pattern) of the conductive paste applied on the alumina substrate.

Next, as illustrated in FIG. 1(b), the alumina substrate was put into an electric furnace for firing at 850° C. for 60 minutes. Two conductor patterns were thus fabricated having tip ends approximately 1.5 mm apart on the alumina substrate.

[Measurement of Electromigration Resistance]

The electromigration resistance of the conductor patterns fabricated using the conductive paste of First through Twelfth Examples and First through Seventh Comparative Examples was measured in the following procedure.

Firstly, as illustrated in FIG. 1(c), ultrapure water was dropped so as to cover the tip ends of the two conductor patterns.

Next, as illustrated in FIG. 1(d), a voltage (40V, 0.1 A) was applied between the two conductor patterns.

Then, time until a value of the current flowing between the two conductor patterns reached from 0 to short circuit was measured, and such measurement was repeated five times to calculate an average value thereof.

Longer time until reaching short circuit means that the electromigration resistance of the conductor pattern is more excellent. The electromigration resistance was evaluated as excellent in the case that the time until reaching short circuit was 30 seconds or more.

[Measurement of Soldering Heat Resistance]

The soldering heat resistance of the conductor patterns fabricated using the conductive paste of First through Twelfth Examples and First through Seventh Comparative Examples was measured in accordance with the method specified in JIS C 0054 "Test methods for solderability, resistance to dissolution of metallization and to soldering heat of surface mounting devices (SMD)".

Specifically, the substrate having the conductor pattern formed therein was immersed in a solder bath at 260° C., and after pulling the substrate out of the solder bath, the conductor pattern remaining on the substrate was visually observed. Then, immersion time until 5% of the area of the conductor pattern disappeared was measured. The soldering heat resistance of the conductor pattern was evaluated as excellent in the case that the immersion time was 20 seconds or more.

[Measurement of Substrate Adhesion]

The adhesion of the conductor patterns, fabricated using the conductive paste of First through Twelfth Examples and First through Seventh Comparative Examples, to substrates was measured in the following procedure.

Firstly, the conductive paste was applied on an alumina substrate in size of 2 mmφ using stencil printing.

After placing a test piece in 32 mm×16 mm on the conductive paste applied on the substrate, the substrate was put into an electric furnace for heating at 850° C. for 60 minutes.

The shear strength (N/mm$^2$) of the test piece to the substrate was measured using a desktop universal tester (1605HTP manufactured by Aikoh Engineering Co., Ltd.).

The adhesion of the conductor pattern to the substrate was evaluated as excellent in the case that the measured shear strength is 70 N/mm$^2$ or more.

TABLE 1

|  |  | Example 1 | Example 2 | Example 3 | Example 4 | Example 5 | Example 6 | Example 7 | Example 8 | Example 9 |
|---|---|---|---|---|---|---|---|---|---|---|
| (A) Silver powder | | 100 | 100 | 100 | 100 | 100 | 100 | 100 | 100 | 100 |
| (B) Glass frit | | 1 | 1 | 1 | 1 | 1 | 1 | 1 | 1 | 1 |
| (C) Organic binder | | 10.5 | 10.5 | 10.5 | 10.5 | 10.5 | 10.5 | 10.5 | 10.5 | 10.5 |
| (D) Powder | Type | Powder of alloy | Powder of alloy | Mixed powder | Powder of alloy | Powder of alloy | Mixed powder | Mixed powder | Mixed powder | Mixed powder |
| | Copper | 0.905 | 0.905 | 0.905 | 0.0905 | 2.715 | 0.3026 | 0.2409 | 0.31845 | 0.25575 |
| | Tin | 0.025 | 0.025 | 0.025 | 0.0025 | 0.075 | 0.0033 | 0.066 | 0.00825 | 0.00825 |
| | Manganese | 0.07 | 0.07 | 0.07 | 0.007 | 0.21 | 0.0231 | 0.0231 | 0.0033 | 0.066 |
| (E) Cobalt oxide | | | 1 | 1 | 1 | 1 | 1 | 1 | 1 | 1 |
| (F) Bismuth oxide | | | 1 | 1 | 1 | 1 | 1 | 1 | 1 | 1 |
| Mass ratio of tin relative to 1 of copper | | 0.027624 | 0.027624 | 0.027624 | 0.027624 | 0.027624 | 0.010905 | 0.273973 | 0.025907 | 0.032258 |
| Mass ratio of manganese relative to 1 of copper | | 0.077348 | 0.077348 | 0.077348 | 0.077348 | 0.077348 | 0.076338 | 0.09589 | 0.010363 | 0.258065 |
| Migration time (s) | | 35 | 40 | 35 | 35 | 80 | 65 | 35 | 75 | 85 |
| Soldering heat resistance (s) | | 20 | 25 | 20 | 25 | 25 | 25 | 20 | 20 | 30 |
| Shear strength (N/mm$^2$) | | 150.8 | 118.7 | 111.0 | | | | | | |

TABLE 2

|  |  | Example 10 | Example 11 | Example 12 |
|---|---|---|---|---|
| (A) Silver powder | | 100 | 100 | 100 |
| (B) Glass frit | | 1 | 1 | 1 |
| (C) Organic binder | | 10.5 | 10.5 | 10.5 |
| (D) Powder | Type | Mixed powder | Mixed powder | Mixed powder |
| | CuO | 0.25575 | 0.1452 | 0.075 |
| | In terms of Cu element | 0.204311 | 0.115996 | 0.059915 |
| | SnO$_2$ | 0.00825 | 0.0096 | 0.0090 |
| | In terms of Sn element | 0.006498 | 0.007562 | 0.007089 |
| | MnO$_2$ | 0.066 | 0.1452 | 0.216 |
| | In terms of Mn element | 0.041707 | 0.091756 | 0.136497 |
| (E) Cobalt oxide | | 1 | 1 | 1 |
| (F) Bismuth oxide | | 1 | 1 | 1 |
| Mass ratio of tin relative to 1 of copper (in terms of element) | | 0.031806 | 0.065189 | 0.118318 |
| Mass ratio of manganese relative to 1 of copper (in terms of element) | | 0.204137 | 0.791031 | 2.27817 |
| Migration time (s) | | 35 | 40 | 35 |
| Soldering heat resistance (s) | | 20 | 25 | 20 |
| Shear strength (N/mm$^2$) | | 150.8 | 118.7 | 111.0 |

TABLE 3

|  |  | Comparative example 1 | Comparative example 2 | Comparative example 3 | Comparative example 4 | Comparative example 5 | Comparative example 6 | Comparative example 7 |
|---|---|---|---|---|---|---|---|---|
| (A) Silver powder | | 100 | 100 | 100 | 100 | 100 | 100 | 100 |
| (B) Glass frit | | 1 | 1 | 1 | 1 | 1 | 1 | 1 |
| (C) Organic binder | | 10.5 | 10.5 | 10.5 | 10.5 | 10.5 | 10.5 | 10.5 |
| (D) Metal powder | Type | None | Copper only | Mn only | Tin only | Mixed powder | Mixed powder | Mixed powder |
| | Copper | | 1 | | | 0.927 | | 0.973 |
| | Tin | | | | 1 | | 0.264 | 0.027 |
| | Manganese | | | 1 | | 0.073 | 0.736 | |

TABLE 3-continued

|  | Comparative example 1 | Comparative example 2 | Comparative example 3 | Comparative example 4 | Comparative example 5 | Comparative example 6 | Comparative example 7 |
|---|---|---|---|---|---|---|---|
| (E) Cobalt oxide | 1 | 1 | 1 | 1 | 1 | 1 | 1 |
| (F) Bismuth oxide | 1 | 1 | 1 | 1 | 1 | 1 | 1 |
| Migration time (s) | 2 | 24 | 32 | 17 | 35 | 30 | 33 |
| Soldering heat resistance (s) | 5 | 10 | 10 | 5 | 15 | 10 | 10 |
| Shear strength (N/mm$^2$) |  | 109.9 | 55.0 | 60.5 | 90.2 | 54.2 | 71.4 |

As seen from the results illustrated in Tables 1 and 2, the conductor patterns obtained by firing the conductive paste of First through Twelfth Examples were excellent in the electromigration resistance, the soldering heat resistance, and the adhesion to the substrate. In contrast, as seen from the results illustrated in Table 3, the conductor patterns obtained by firing the conductive paste of First through Seventh Comparative Examples were poor in the electromigration resistance, the soldering heat resistance, and the adhesion to the substrate.

As seen from comparing the results of First Example and Second Example, the conductive paste containing cobalt oxide and bismuth oxide was more excellent in the migration resistance and the soldering heat resistance than conductive paste not containing cobalt oxide and bismuth oxide.

As seen from the results of First through Twelfth Examples, the conductive paste containing from 0.1 to 3.0 parts by mass of the powder (D) containing copper, tin, and manganese based on 100 parts by mass of the silver powder (A) was excellent in the electromigration resistance, the soldering heat resistance, and the adhesion to the substrate.

As seen from the results of First through Twelfth Examples, the conductive paste containing from 0.0905 to 2.715 parts by mass of copper (Cu) based on 100 parts by mass of the silver powder (A) was excellent in the electromigration resistance, the soldering heat resistance, and the adhesion to the substrate.

As seen from the results of First through Twelfth Examples, the conductive paste containing from 0.0025 to 0.075 parts by mass of tin (Sn) based on 100 parts by mass of the silver powder (A) was excellent in the electromigration resistance, the soldering heat resistance, and the adhesion to the substrate.

As seen from the results of First through Twelfth Examples, the conductive paste containing from 0.0033 to 0.21 parts by mass of manganese (Mn) based on 100 parts by mass of the silver powder (A) was excellent in the electromigration resistance, the soldering heat resistance, and the adhesion to the substrate.

As seen from the result of First Comparative Example, the conductive paste not containing copper, tin, and manganese was resulted poorly in the electromigration resistance, the soldering heat resistance, and the adhesion to the substrate.

As seen from the result of Second Comparative Example, the conductive paste containing copper only was resulted poorly in the electromigration resistance, the soldering heat resistance, and the adhesion to the substrate.

As seen from the result of Third Comparative Example, the conductive paste containing manganese only was resulted poorly in the soldering heat resistance and the adhesion to the substrate.

As seen from the result of Fourth Comparative Example, the conductive paste containing tin only was resulted poorly in the electromigration resistance, the soldering heat resistance, and the adhesion to the substrate.

As seen from the result of Fifth Comparative Example, the conductive paste containing copper and manganese only was resulted poorly in the soldering heat resistance and the adhesion to the substrate.

As seen from the result of Sixth Comparative Example, the conductive paste containing manganese and tin only was resulted poorly in the soldering heat resistance and the adhesion to the substrate.

As seen from the result of Seventh Comparative Example, the conductive paste containing copper and tin only was resulted poorly in the soldering heat resistance and the adhesion to the substrate.

The invention claimed is:

1. A conductive paste comprising:
   (A) a silver powder;
   (B) a glass frit;
   (C) an organic binder; and
   (D) a powder containing copper, tin, and manganese,
   wherein a mass ratio of tin to copper is 0.01 to 0.3:1, and a mass ratio of manganese to copper is 0.01 to 2.5:1 and the powder (D) is contained in an amount of 0.1 to 5.0 parts by mass based on 100 parts by mass of the silver powder (A).

2. The conductive paste according to claim 1, wherein the powder (D) is a mixed powder of metals including copper, tin, and manganese.

3. The conductive paste according to claim 1, wherein the powder (D) is a powder of an alloy containing copper, tin, and manganese.

4. The conductive paste according to claim 1, wherein the powder (D) is a powder of a compound containing copper, tin, and manganese.

5. The conductive paste according to claim 1, wherein the powder (D) contains an oxide or a hydroxide of one or more of copper, tin, and manganese.

6. The conductive paste according to claim 1, wherein the silver powder (A) has an average particle diameter from 0.1 μm to 100 μm.

7. The conductive paste according to claim 1, further comprising cobalt oxide (E).

8. The conductive paste according to claim 1, further comprising bismuth oxide (F).

9. The conductive paste according to claim 1, wherein the paste has a viscosity from 50 to 700 Pa·s.

10. A printed circuit board obtained by, after applying the conductive paste according to claim 1 on a substrate, firing the substrate at a temperature of 500° C. to 900° C.

11. An electronic device obtained by soldering an electronic part on the printed circuit board according to claim 10.

* * * * *